(12) United States Patent
Shichijo et al.

(10) Patent No.: US 11,011,671 B2
(45) Date of Patent: May 18, 2021

(54) LIGHT EMITTING DEVICE (71) Applicant: NICHIA CORPORATION, Anan (JP)

(72) Inventors: Satoshi Shichijo, Tokushima (JP); Harunobu Sagawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/440,894

(22) Filed: Jun. 13, 2019

(65) Prior Publication Data
US 2019/0386171 A1    Dec. 19, 2019

(30) Foreign Application Priority Data

Jun. 14, 2018 (JP) .............................. JP2018-113833
Feb. 18, 2019 (JP) .............................. JP2019-026506

(51) Int. Cl.
H01L 33/00 (2010.01)
H01L 33/18 (2010.01)
H01L 33/50 (2010.01)

(52) U.S. Cl.
CPC .......... H01L 33/0095 (2013.01); H01L 33/18 (2013.01); H01L 33/502 (2013.01); H01L 2933/0033 (2013.01); H01L 2933/0041 (2013.01)

(58) Field of Classification Search
CPC ........... H01L 33/502; H01L 2933/0041; H01L 33/0093; H01L 33/50
See application file for complete search history.

(56) References Cited

U.S. PATENT DOCUMENTS

2013/0026527 A1* 1/2013 Ichikawa ................ H01L 33/18
                                                              257/98
2014/0138348 A1  5/2014 Inamori et al.
2015/0076548 A1  3/2015 Ichikawa
2015/0118771 A1  4/2015 Ichikawa
2020/0124955 A1* 4/2020 Hu ....................... G03B 21/204

FOREIGN PATENT DOCUMENTS

JP    2012-142326 A    7/2012
JP    WO-2011/126000 A1    7/2013
JP    WO-2013/008751 A1    2/2015
JP    2018-022723 A    2/2018

* cited by examiner

Primary Examiner — Jay C Chang
Assistant Examiner — Mikka Liu
(74) Attorney, Agent, or Firm — Foley & Lardner LLP (57) ABSTRACT A light emitting device includes: a light emitting element; and a light transmissive member bonded to an emission surface of the light emitting element; wherein the light emitting element and the light transmissive member are bonded via a bonding portion that comprises a portion of the light emitting element and a portion of the light transmissive member; wherein the bonding portion contains at least one rare gas element selected from the group consisting of He, Ne, Ar, and Kr; and wherein a peak of a rare gas element distribution is positioned away from the emission surface in at least one of the light emitting element and the light transmissive member.

18 Claims, 5 Drawing Sheets

LIGHT EMITTING DEVICE

CROSS-REFERENCE TO RELATED APPLICATION

This application claims priority to Japanese Patent Application No. 2018-113833, filed on Jun. 14, 2018, and Japanese Patent Application No. 2019-026506, filed on Feb. 18, 2019, the disclosures of which are hereby incorporated by reference in their entireties.

BACKGROUND

The present disclosure relates to a light emitting device and a method of manufacturing the same.

A light emitting device equipped with a light emitting element, such as a light emitting diode, and a wavelength conversion member that is excited by the light from the light emitting element and emits light having a different wavelength from that of the light emitted by the light emitting element has been in use. For example, Japanese Patent Application Publication No. 2012-142326 discloses a light emitting device where a light emitting element is bonded to a phosphor part, which is a wavelength conversion member, by using a surface activated bonding method. It is believed that such a method of manufacturing a light emitting device can reduce manufacturing costs, and achieve good emission characteristics.

SUMMARY

However, a higher luminous intensity for a light emitting device has been pursued, so that there is a need for a light emitting device with less light loss at the bonding portion between the light emitting element and the wavelength conversion member.

Accordingly, one object of certain emebodiments described in the present disclosure is to provide a light emitting device with less light loss at the bonding portion between the light emitting element and the light transmissive member, and a method of manufacturing the same.

In order to achieve the object described above, a light emitting device according to one embodiment of the present disclosure includes a light emitting element and a light transmissive member bonded to an emission surface of the light emitting element. The light emitting element and the light transmissive member are bonded via a bonding portion configured with a portion of the light emitting element and a portion of the light transmissive member. The bonding portion contains at least one rare gas element selected from the group consisting of He, Ne, Ar, and Kr. A peak of the rare gas element distribution is positioned away from the emission surface in at least one of the light emitting element and the light transmissive member.

A method of manufacturing a light emitting device according to one embodiment of the present disclosure includes providing a light emitting element, providing a light transmissive member, and bonding the light emitting element and the light transmissive member by a surface activated bonding method. The bonding step includes: activating a first surface, which activates a first bonding surface of the light emitting element to which the light transmissive member is to be bonded by irradiating with an ion beam of at least one rare gas element selected from the group consisting of He, Ne, Ar, and Kr; activating a second surface, which activates a second bonding surface of the light transmissive member to which the light emitting element is to be bonded by irradiating with an ion beam of at least one rare gas element selected from the group consisting of He, Ne, Ar, and Kr; and joining the light emitting element and the light transmissive member by bringing the activated first bonding surface and the activated second bonding surface into contact. In at least one of the first surface activation step and the second surface activation step, the rare gas element ion beam irradiates the first bonding surface or the second bonding surface at a predetermined angle such that the rare gas element is distributed with a high density at a deeper position than a vicinity of the first bonding surface or the second bonding surface.

The light emitting device according to certain embodiments of the present disclosure can achieve less light loss at the bonding portion between the light emitting element and the light transmissive member.

Furthermore, a method of manufacturing a light emitting device according to one embodiment of the present disclosure can manufacture a light emitting device with less light loss at the bonding portion between the light emitting element and the light transmissive member.

DESCRIPTION

The light emitting device according to certain embodiments of the present disclosure includes a light emitting element and a light transmissive member, where the light transmissive member is bonded to the emission surface of the light emitting element by surface activated bonding, and the light emitting element and the light transmissive member are bonded via a bonding portion. The bonding portion is configured with a portion of the light emitting element and a portion of the light transmissive member located on both sides of the emission surface of the light emitting element after being bonded as described below. The portion of the light emitting element serving as the bonding portion refers the portion from the emission surface to a predetermined depth that contains the rare gas element used in the ion beam irradiation for activating the emission surface of the light emitting element. The portion of the light transmissive member portion serving as the bonding portion refers the portion from the bonding surface to a predetermined depth that contains the rare gas element used in the ion beam irradiation for activating the bonding surface of the light transmissive member. The rare gas element used in ion beam irradiation is at least one of He, Ne, Ar, and Kr.

According to certain embodiments of the light emitting device, the peak portion of the distribution of the rare gas element used in activating a portion of the surface of the light emitting element in the bonding portion is positioned away from the emission surface.

The light emitting device constructed as above can achieve less light loss at the bonding portion between the light emitting element and the light transmissive member. Moreover, the bonding strength can further be enhanced.

The crystal lattice at the surface of the light emitting element or the light transmissive member subjected to ion beam irradiation and the vicinity thereof may be irregular or strained as compared to those prior to irradiation, and these phenomena can be caused by a high density content of the rare gas element resulting from ion beam irradiation. According to certain embodiments of the light emitting device, the peak of the rare gas element distribution is positioned away from the emission surface. This can reduce irregularities in the crystal lattice at the emission surface and the vicinity thereof attributable to the presence of a rare gas element, thereby allowing the crystallinity to be relatively retained. Moreover, the portion where the crystal lattice is strained can be positioned apart from the emission surface.

That is, the rare gas element distribution has no peak at the emission surface or the vicinity thereof in the light emitting element and/or the light transmissive member, so that the crystal orientation in the portion of the light emitting element and/or the portion of the light transmissive member at the emission surface and the vicinity thereof is considered relatively less likely to be irregular. This can reduce light loss at the bonding portion between the light emitting element and the light transmissive member. That is, light is readily scattered if the crystal lattice is irregular, for example, if it is non-crystalline (i.e., amorphous) or the like, near the bonding interface. Scattering of light can be reduced by comparatively aligning the crystal orientations in the bonding portion. Less scattering can reduce absorption of light attributable to multiple scattering, which can increase the light extraction efficiency.

In the light emitting device according to the embodiment, the peak of the rare gas element distribution is positioned away from the emission surface where the rare gas element contained can strain the crystal. This allows the bonding portion to retain high bonding strength even when stress from deformation caused by the heat generated by the light emitting element or the ambient temperature change is repeatedly applied to the bonding portion.

If crystal orientation irregularities are concentrated in the immediate vicinity of the bonding interface (or emission surface), for example, the portion of about ±2 nm in thickness from the bonding interface, external forces or thermal stress would concentrate in this portion. In contrast, the peak of the rare gas element distribution positioned away from the emission surface, as in the case of the light emitting device according to certain embodiments, can form a portion where the crystal lattice is strained by the rare gas element positioned away from the emission surface. This allows not only the immediate vicinity of the bonding interface (or emission surface), but also the strained portion to disperse the stress. This thus can improve the bonding strength.

In the light emitting device according to the embodiment described above, the light transmissive member can be formed with, for example, sapphire, GaN, or the like. The light transmissive member formed of these materials can readily be made smooth surface, thereby facilitating surface activated bonding. Furthermore, forming the light transmissive member with the same material as that of the bonding surface of the light emitting element can essentially eliminate the interfacial reflection caused by a difference between the refractive indexes of the two, thereby further improving the light extraction efficiency. Employing the same constituent elements for the bonding portions of the light transmissive member and the light emitting element can further enhance the bonding strength between the two.

The light transmissive member may contain a phosphor to have the wavelength conversion function as in the case of the specific example described below.

The light emitting device according to certain embodiments, and methods of manufacturing the same, will be explained below with reference to the drawings.

Figure 1A:
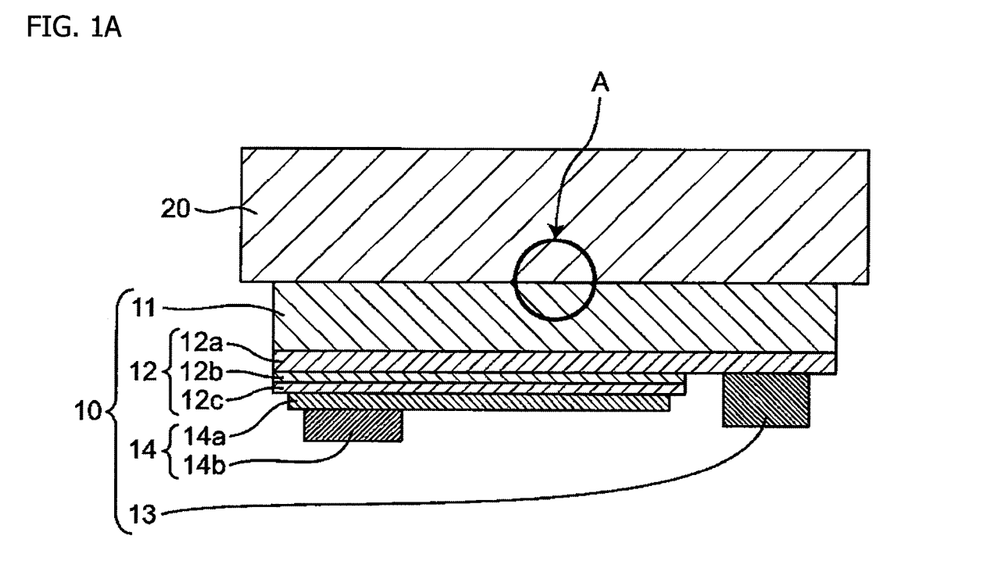
FIG. 1A is a cross-sectional view of an example of the light emitting device according to one embodiment.

FIG. 1A is a cross-sectional view of a specific example of the light emitting device according to one embodiment.

Figure 1B:
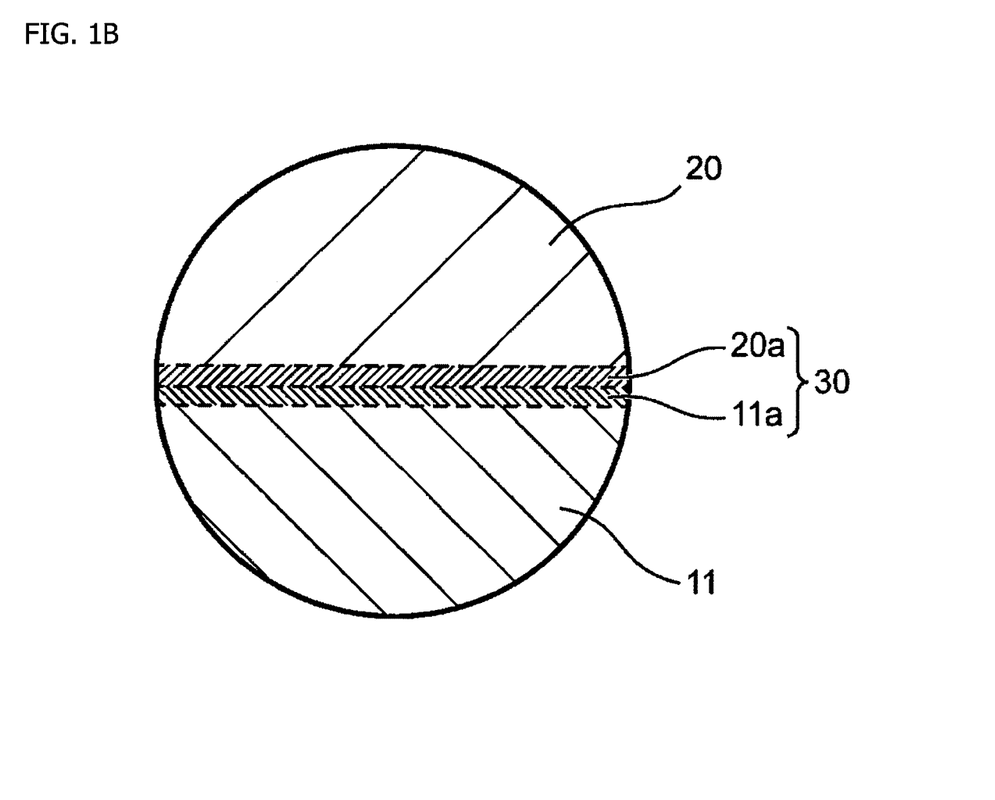
FIG. 1B is a cross-sectional view showing an enlaged portion of FIG. 1A.

FIG. 1B is a cross-sectional view showing an enlarged portion of FIG. 1A. In the light emitting device shown in FIG. 1A, the light emitting element 10 includes, for example, a substrate 11 and a semiconductor stack 12 that has an n-side semiconductor layer 12a, an active layer 12b, and a p-side semiconductor layer 12c; an n-electrode 13 connected to the n-side semiconductor layer 12a; and a p-electrode 14 connected to the p-side semiconductor layer 12c. The n-electrode 13 is formed on the surface of the n-side semiconductor layer 12a exposed by removing a portion of the p-side semiconductor layer 12c and a portion of the active layer 12b. The p-electrode 14 includes a diffusion electrode 14a formed across substantially the entire surface of the p-side semiconductor layer 12c for diffusing electrical current and a p-pad electrode 14b formed on the diffusion electrode 14a.

In the light emitting device, various types of known elements can be used for the light emitting element 10. For a light emitting element structured with a nitride semiconductor, for example, sapphire, GaN, or the like can be used for the substrate 11. The n-side semiconductor layer 12a, the active layer 12b, and the p-side semiconductor layer 12c can be formed by selecting among various nitride semiconductors, including binary compositions such as GaN, ternary compositions such as GaInN and AlGaN, and quaternary compositions such as AlInGaN, and the like in accordance with the application.

In this example of the light emitting device, the light transmissive member 20 is a wavelength conversion member made of a phosphor or one containing a phosphor.

The light transmissive member 20 used in this example is a wavelength conversion member that is excited by the light from the light emitting element 10 (hereinafter referred to as the first light) and emits light having a different wavelength from that of the first light. The light transmissive member 20 can be formed with, for example, a polycrystal or monocrystal made of a phosphor, a composite of a phosphor and a binder, or a sintered body formed by molding and sintering phosphor powder and binder powder. For the binder, aluminum oxide, aluminum nitride, YAG (not containing an activating agent and thus not emitting light), yttrium oxide or the like can be used.

For the phosphor, those made of various materials can be used. For example, using an yttrium aluminum garnet (YAG)-based phosphor or terbium aluminum garnet (TAG)-based phosphor enables emission of white light by combining with a blue light emitting element 10. For the blue light emitting element 10, for example, a nitride semiconductor light emitting element including nitride semiconductors can be used.

In the case of employing a composite of a phosphor and a binder for the light transmissive member 20, for example, a sintered body of a phosphor and a binder, the same base material is preferably used for the phosphor and the binder. This can essentially eliminate the refractive index difference between the phosphor and the binder, thereby reducing reflection at the interface between the binder and the phosphor. For example, YAG (not containing an activating agent and thus not emitting light) can be used for the binder, and a so-called YAG-based phosphor, using cerium for the activating agent and YAG for the base material, can be used for the phosphor. The wavelength conversion member, moreover, may contain a scattering agent. For the light transmissive member 20 capable of wavelength conversion, for example, a YAG ceramic can be used. Examples of the YAG ceramics include a sintered body of a YAG phosphor and a binder, and a sintered body of a YAG phosphor without essentially using a binder.

In the light emitting device shown in FIG. 1A, the emission surface of the light emitting element 10 (i.e., the opposite surface to the surface of the substrate 11 on which semiconductor stack 12 is formed) and the light transmissive member 20 are bonded via a bonding portion 30. The bonding portion 30, as shown in FIG. 1B, is composed of a first bonding portion 11$a$, which is a portion of the light emitting element 10 (i.e., substrate 11), and a second bonding portion 20$a$, which is a portion of the light transmissive member 20. The first bonding portion 11$a$ and the second bonding portion 20$a$ are the portions that contain the rare gas element used in activating the bonding surfaces by ion beam irradiation, as described above. The first bonding portion 11$a$ is in a state where the crystal structure can be recognized and crystallinity is retained, and the distribution of the amount of the rare gas element used during activation has a peak at a positon away from the bonding interface (or emission surface). Whether the crystal structure is retained or not, in other words, whether the first bonding portion 11$a$ and the second bonding portion 20$a$ are non-crystalline or not, can be determined by, for example, diffraction testing where the presence of diffraction spots are observed. In this embodiment, a YAG ceramic is used for the light transmissive member 20, which is not a single crystal as a whole. In this case, the portion of the light transmissive member 20 where the crystal lattice has been made irregular by ion beam irradiation refers to the portion where the contrast differs when observing a cross-sectional TEM image. In the observed TEM image of a cross section, if the contrast differs between the bonding interface or its vicinity and the portion outwards thereof, the crystal is considered strained at the bonding interface and its vicinity, and such portion is referred to as a strained layer.

In the case of employing sapphire for the substrate 11, the first bonding portion 11$a$ is formed, for example, at the portion 10 nm to 40 nm away from the emission surface (or bonding surface) of the light emitting element 10 on the substrate 11 in the thickness direction. The bonding portion may include a portion that contains substantially no rare gas element in the vicinity of the bonding interface. The rare gas element content in the strained layer is preferably smaller than that in the peak portion throughout the layer. It is believed that this can reduce the possibility of causing irregularity in the arrangement of atoms in the strained layer.

When using a YAG ceramic as the light transmissive member 20, the second bonding portion 20$a$ is formed, for example, at the portion 5 nm to 20 nm away from the emission surface (i.e., bonding surface) of the light emitting element 10. The peak of the rare gas element distribution in the second bonding portion 20$a$ can substantially coincide with the bonding interface. The position that substantially coincides with the bonding interface refers to the position that is 2 nm at most away from the bonding interface. The bonding interface can be identified by using a TEM image in combination with an EDX analysis (energy-dispersive X-ray analysis). If the boundary between the substrate 11 and the light transmissive member 20 is vague and difficult to be identified, the presence of the peak of the rare gas element distribution in the portion estimated as the bonding interface can simply be considered as the peak substantially coinciding with the bonding interface. The ranges where the first bonding portion 11$a$ and the second bonding portion 20$a$ are formed can be adjusted by the ion beam irradiation conditions. Accordingly, suitably setting the ion beam irradiation conditions by taking into account the materials used for the substrate 11 and/or the light transmissive member 20, the required bonding strength, and light absorption, can be suitably adjusted the thickness of the bonding portion 30 and the rare gas element distribution.

In the above specific example described with reference to FIG. 1, a light emitting element 10 including a substrate 11 is used where the substrate 11 and the light transmissive member 20 are directly bonded. However, in the light emitting device according to the embodiment, the light transmissive member 20 can be directly bonded to the semiconductor stack 12 of the light emitting element 10 that includes a substrate 11, or the semiconductor stack 12 can be directly bonded to the light transmissive member 20 by using a light emitting element 10 in which a substrate 11 is absent. That is, regardless of the presence or absence of a substrate, the semiconductor stack 12 and the light transmissive member 20 can be bonded. In the case of bonding the semiconductor stack 12 and the light transmissive member 20, the bonding portion is formed by a portion of the light transmissive member 20 and a portion of the outermost part of the semiconductor stack 12. Alternatively, the light emitting element 10 can be formed by forming the semiconductor stack 12 on the substrate 11, bonding the semiconductor stack 12 on a support substrate such as Si, thereafter removing an original substrate. In this case, the support substrate on which the semiconductor stack 12 is formed is bonded to the light transmissive member 20.

Next, a method of manufacturing a light emitting device according to the embodiment will be explained.

Figure 2A:
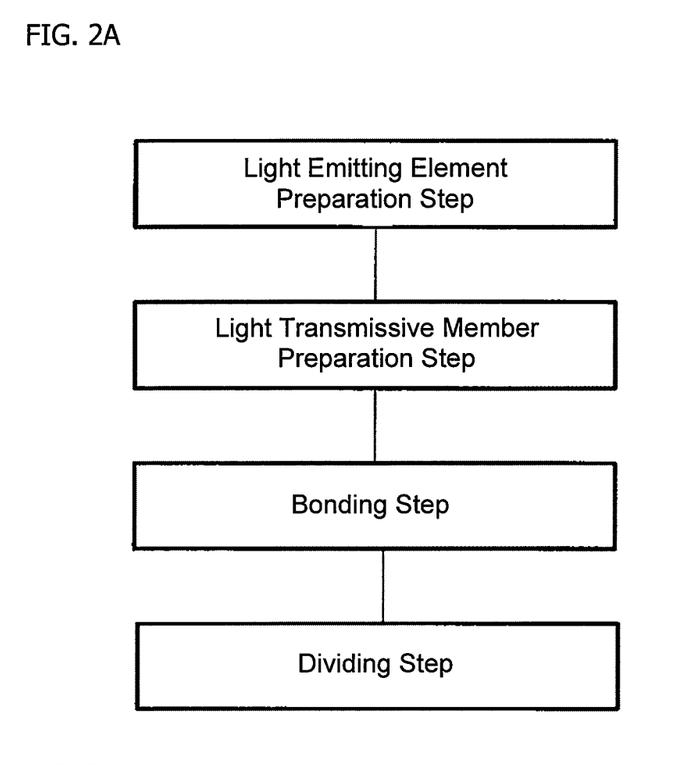
FIG. 2A is a flowchart of the method of manufacturing a light emitting device according to the embodiment.
Figure 2B:
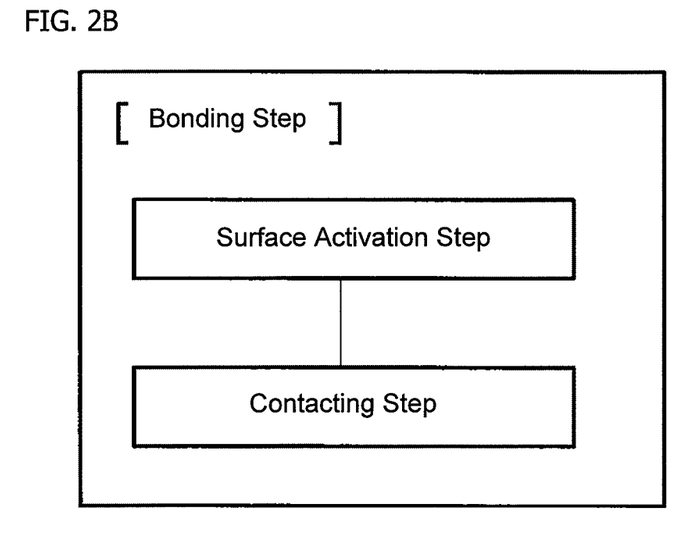
FIG. 2B is a flowchart of the bonding step in the method of manufacturing a light emitting device according to the embodiment.

The method of manufacturing a light emitting device according to the embodiment, as shown in FIG. 2A, includes a step of providing light emitting elements, a step of providing wavelength conversion members, a step of bonding, and a step of dividing devices. The step of bonding, as shown in FIG. 2B, includes a surface activation step and a joining step. Each step will be explained in detail below.

1. Light Emitting Element Providing Step

In the light emitting element providing step, light emitting elements are provided. In the light emitting element providing step, it is preferable to polish the surfaces to which light transmissive members will be bonded into smooth surfaces having a surface roughness (Ra) of, for example, 10 nm at most, preferably 5 nm at most, more preferably 1 nm at most. This can more easily and securely bond the light emitting elements 10 and the light transmissive members 20.

For example, the light emitting element 10 shown in FIG. 1A can be provided as described below.

A wafer is provided, which will be divided into multiple substrates 11 later. In the case of providing nitride semiconductor light emitting elements, the wafer employed is, for example, a sapphire wafer.

Subsequently, on the upper surface of the wafer, an n-side semiconductor layer 12a, an active layer 12b, and a p-side semiconductor layer 12c, which form the semiconductor stack 12, are grown. The n-side semiconductor layer includes an n-side semiconductor. The p-side semiconductor layer includes a p-side semiconductor.

Subsequently, a portion of the p-side semiconductor layer 12c and a portion of the active layer 12b are removed to expose the n-side semiconductor layer 12a in a region of each of the light emitting element 10.

Subsequently, an n-electrode 13 is formed on the exposed surface of the n-side semiconductor layer 12a in each region.

Subsequently, a p-electrode 14 is formed on the surface of the p-side semiconductor layer 12c in each region.

The p-electrode 14 includes a diffusion electrode 14a for electrical current diffusion formed substantially across the entire surface of the p-side electrode layer 12c in each region, and a p-pad electrode 14b formed on a portion of each diffusion electrode.

Subsequently, the lower surface of the wafer is polished to make it a smooth surface having a surface roughness (Ra) of, for example, 10 nm at most, preferably 5 nm at most, more preferably 1 nm at most by, for example, mechanical polishing or chemical mechanical polishing (CMP). A step of adjusting the thickness of the wafer to a desired thickness, for example, may be performed prior to performing chemical or mechanical polishing on the lower surface of the wafer.

When polishing a member composed of multiple materials, there are some cases in which mechanical polishing is preferable instead of CMP. For example, in the case in which a YAG ceramic contains a diffuser, there tends to be a large difference between the etching rate for the diffuser and the etching rate for the phosphor. For this reason, flattening is preferably performed by mechanical polishing. In this manner, the surface flattened by mechanical polishing can be smoother than a surface flattened by CMP.

After polishing, the wafer is divided into individual light emitting elements 10. Light emitting elements 10 each having a polished smooth bonding surface (or emission surface) are obtained as described above.

2. Light Transmissive Member Providing Step

In the light transmissive member providing step, a light transmissive sheet that will be separated into multiple light transmissive members 20 is provided. In the light transmissive member providing step, it is preferable to polish the surface to which light emitting elements will be bonded to a surface roughness (Ra) of, for example, 10 nm at most, preferably 5 nm at most, more preferably 1 nm at most. This can more easily and securely bond the light emitting elements 10 and the light transmissive members 20.

For example, in the case of providing a light transmissive member 20 formed using sapphire (i.e., support base) containing a YAG (i.e., phosphor) illustrated in FIG. 1A, a light transmissive sheet, which will be later divided into multiple light transmissive members 20, is provided by, for example, unidirectional solidification. In the light transmissive member providing step, a step of achieving a desired thickness of the light transmissive sheet by polishing or grinding can be included so that the light emitting devices can emit light having a predetermined chromaticity. In the light transmissive member providing step, the light transmissive sheet may be divided into individual light transmissive members. The light emitting element providing step and the light transmissive providing step may be performed in reverse order.

3. Bonding Step

In the bonding step, the bonding surfaces of the light emitting elements and the bonding surfaces of the light transmissive members are activated by rare gas element ion beam irradiation (i.e., surface activation step), followed by bringing the activated surfaces into contact (i.e., joining step).

In the bonding step, particularly in the surface activation step, a rare gas element ion beam is irradiated at a predetermined angle on at least either the bonding surface of the light emitting elements or the bonding surface of the light transmissive members, whereby the rare gas element is distributed with high density at a deeper position than a vicinity of the bonding surface of the light emitting elements or the bonding surface of the light transmissive members. The details will be described below.

3a. Surface Activation Step

Figure 3A:
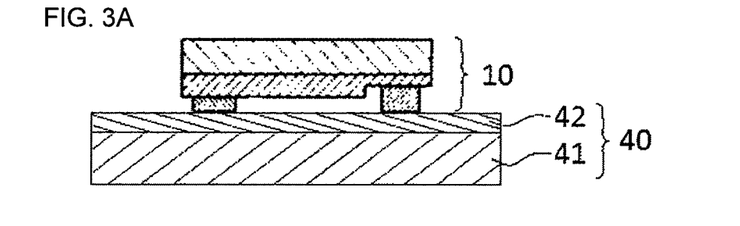
FIG. 3A includes schematic illustrations of the bonding step in the method of manufacturing a light emitting device according to the embodiment.

As shown in FIG. 3A, multiple light emitting elements 10 are arranged in a row on an intermediate substrate 40 in which an applied silicone resin 42 is cured on a substrate 41. At this time, the light emitting elements 10 are held in place by the tackiness of the silicone resin 42. The light emitting elements 10 are held on the intermediate substrate 40 using the surfaces opposite the emission surfaces (i.e., bonding surfaces) of the light emitting elements 10. For example, the light emitting element 10 shown in FIG. 1A is held on the intermediate substrate 40 using the surface having the p-electrode 14 and the n-electrode 13 formed thereon.

Figure 3B:
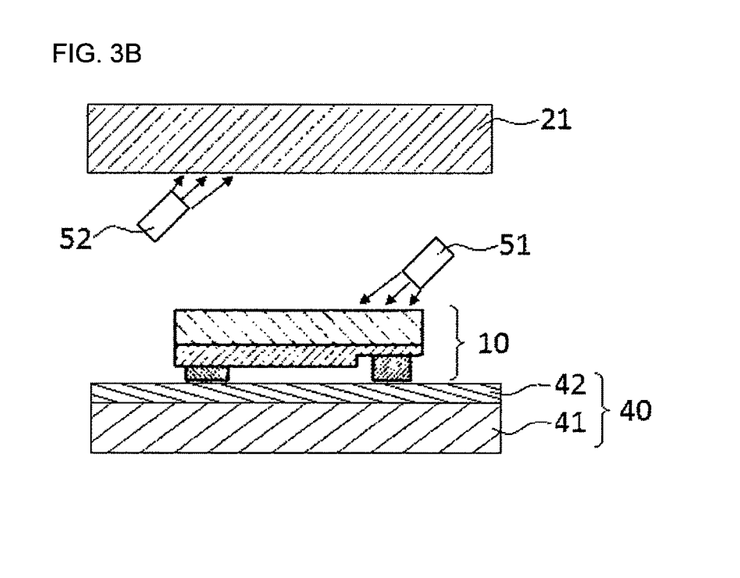
FIG. 3B includes schematic illustrations of the bonding step in the method of manufacturing a light emitting device according to the embodiment.

Subsequently, the light emitting elements 10 arranged on the intermediate substrate 40 and the light transmissive sheet 21 are placed in a bonding chamber so as to oppose each other as shown in FIG. 3B. For example, the intermediate substrate 40 having the light emitting elements 10 arranged thereon is placed in the upper portion of the bonding chamber so that the emission surfaces surface down, and the light transmissive sheet 21 is placed in the lower portion of the bonding chamber so that the bonding surface surfaces up. After placing the light emitting elements 10 and the light transmissive sheet 21 in the bonding chamber, the bonding chamber is evacuated to a pressure level of, for example, $1 \times 10^{-5}$ Pa at most, preferably $5 \times 10^{-6}$ Pa at most.

A first high-speed ion beam gun 51 that irradiates the emission surfaces of the light emitting elements 10 with an ion beam, and a second high-speed ion beam gun 52 that irradiates the bonding surface of the light transmissive sheet with an ion beam are placed in the center of the bonding chamber. The center of the bonding chamber is an area interposed between the intermediate substrate 40 having multiple light emitting elements arranged thereon and the light transmissive sheet 21. A light shielding plate is preferably disposed between the first high-speed ion beam gun 51 and the second high-speed ion beam gun 52 so that the ion beam from the first high-speed ion beam gun 51 would not irradiate the light transmissive sheet and the ion beam from the second high-speed ion beam gun 52 would not irradiate the light emitting elements.

The first high-speed ion beam gun 51 and the second high-speed ion beam gun 52 are preferably structured so that the irradiation directions can be adjusted to irradiate ion beams on the emission surfaces of the light emitting elements 10 and the bonding surface of the light transmissive sheet 21 at a predetermined angle. This allows the rare gas elements to penetrate to a predetermined depth. Furthermore, the first high-speed ion beam gun 51 and the second high-speed ion beam gun 52 are preferably structured to irradiate the light emitting surfaces of the light emitting elements 10 and the bonding surface of the light transmissive sheet 21 with ion beams at a constant irradiation angle. Such ion bean irradiation refers to the first surface activation step and the second surface activation step. The first surface activation step may be performed before, after, or simultaneously with the second surface activation step. The ion beam irradiation at a constant angle on the emission surfaces of the light emitting elements and/or the bonding surface of the light transmissive sheet can achieve a high density distribution of the rare gas elements used in ion beam irradiation at a desired depth distant from the bonding surface (or emission surface) in a stable manner. That is, the present inventors confirmed that the penetration depth of the rare gas elements during ion beam irradiation varies depending on the ion beam irradiation angle relative to the crystal surface of the bonding surface (or emission surface). Accordingly, if the ion beam irradiation angle changes relative to the bonding surface (or emission surface), the penetration depth of the rare gas elements would change, which makes it difficult to stably distribute the rare gas elements at a desired depth. For example, when irradiating an ion beam on sapphire, the angle of incidence of the ion beam is preferably set in the range of from 40 to 50 degrees, more preferably about 45 degrees plus or minus one degree, relative to a C plane of the sapphire. The angle of incidence of the ion beam refers to the angle formed by the normal line of the end surface of the ion beam outlet and the normal line of the bonding surface. The end surface of the ion beam outlet refers to the surface of the first high-speed ion beam gun 51 that surfaces the bonding surfaces of the light emitting elements 10 as shown in FIG. 3B for example.

Taking the above into consideration, in the method of manufacturing a light emitting device according to this embodiment, it is preferable to irradiate ion beams from the first high-speed ion beam gun 51 and the second high-speed ion beam gun 52 at a predetermined irradiation angle by focusing the respective beams to narrow ranges while being moved across the entire target regions. Moving irradiation can reduce the spreading of an ion beam as compared to stationary irradiation, thereby reducing the deviation of the ion beam from the irradiation angle. Accordingly, in the surface activation step, irradiation of the rare gas element ion beam can be performed at a predetermined angle relative to at least one of the first bonding surface and the second bonding surface while being moving in at least one of the first surface activation step and the second surface activation step.

3b. Joining Step

Figure 3C:
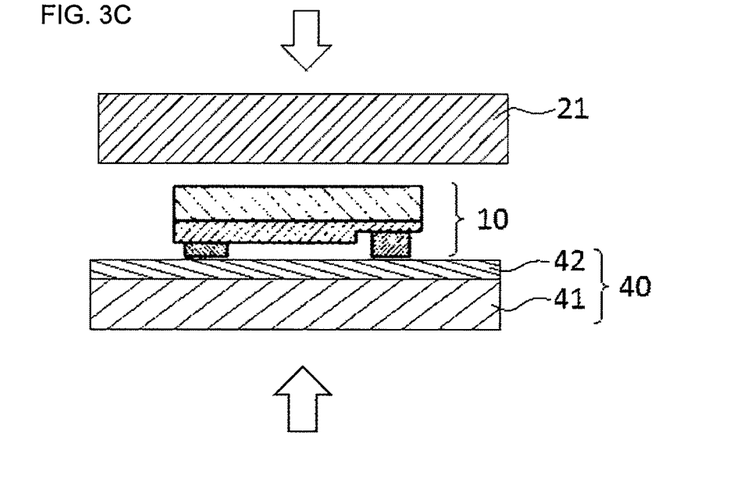
FIG. 3C includes schematic illustrations of the bonding step in the method of manufacturing a light emitting device according to the embodiment.

As shown in FIG. 3C, the light emitting element and the light transmissive sheet are joined by bringing the activated emission surface (i.e., first contact surface) of the light emitting element and the activated bonding surface (i.e., second bonding surface) of the light transmissive sheet into contact. At this time, no adhesive is interposed between the light emitting elements and the light transmissive sheet. Pressure may be applied when they are brought into contact. The silicone resin temporarily holding the light emitting elements in place is soft, thus good bonding can be achieved even if there is a variance in the thicknesses of the light emitting elements. At this point, it is preferable to temporarily bond them with relatively low pressure before they are fully bonded with higher pressure than that for temporarily bonding. The pressuring step does not need to be performed.

4. Dividing Step

In the dividing step, the light transmissive sheet bonded to the light emitting elements is taken out of the bonding chamber, and cut into individual light emitting devices by, for example, following the steps described below.

The multiple light emitting elements bonded to the light transmissive sheet is removed from the bonding chamber, and the intermediate substrate is removed from the bonded body.

Subsequently, the light transmissive sheet is divided into individual light emitting devices, for example, by dicing so that each includes at least one light emitting element.

After being divided, each light emitting device may be flip-chip mounted on a substrate that includes wiring electrodes formed thereon, and covered with, for example, a white resin formed of a silicone resin containing titanium particles, so as to expose the upper surface of the light transmissive member, which serves as the emission surface of the light emitting device.

The light emitting devices according to the embodiment can be manufactured as described above.

The method of manufacturing a light emitting device according to the embodiment described above can manufacture a light emitting device where the light emitting element and the light transmissive member are directly bonded via a bonding portion in which the peak of the rare gas element distribution is positioned away from the bonding surface (or emission surface).

EXAMPLE

In this example, a light emitting element including a semiconductor stack formed on a sapphire substrate, and a YAG ceramic containing a YAG phosphor employed as the light transmissive member was provided.

The bonding surface of the sapphire substrate and the bonding surface of the YAG ceramic were polished to each have a surface roughness Ra of 1 nm.

Subsequently, the light emitting element and the YAG ceramic were set in a bonding chamber so that their bonding surfaces oppose to each other, and the chamber was evacuated so that the ultimate vacuum is $2 \times 10^{-6}$ Pa.

The surface of the sapphire substrate (i.e., bonding surface), which is the emission surface of the light emitting element, and the surface of the YAG ceramic (i.e., bonding surface) were respectively activated by irradiating with an Ar ion beam at a predetermined angle. In this example, the emission surface, which is the bonding surface of the sapphire substrate, was in a C plane, and the Ar ion beam was irradiated so that the angle defined by the C plane and the ion beam outlet of the ion beam source was 45 degrees. The flow rate of the Ar ion beam was 20 sccm (equivalent to accelerating voltage of about 1 keV), and the accelerating current was 100 mA. The ion beam size was slightly smaller than the YAG ceramic surface. The ion beam was irradiated at a constant irradiation angle relative to each bonding surface while being moved. The ion beam was repeatedly irradiated while being moved. The time of repeatedly moving ion beam irradiation was about 300 seconds.

Subsequently, the activated surface of the sapphire (i.e., bonding surface) and the activated surface of the YAG ceramic (i.e., bonding surface) were temporarily bonded and then fully bonded.

The crystallinity and the Ar distribution were evaluated using a cross section that included the bonding portion of the sapphire and the YAG ceramic bonded as described above and the portions of the sapphire and the YAG ceramic located on both sides intervened by the bonding portion.

Figure 4:
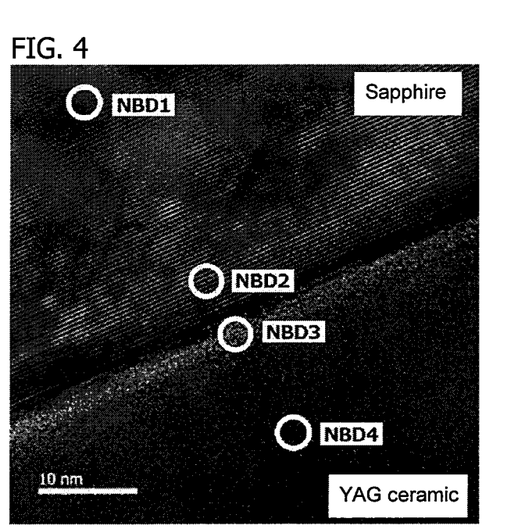
FIG. 4 is a transmission electron microscopy (TEM) image of an area containing a portion of the sapphire substrate and a portion of the YAG ceramic in one example.

FIG. 4 shows a high resolution TEM image of the cross section of the bonding portion and the portions of the sapphire and the YAG ceramic intervened by the bonding portion. FIGS. 5A through 5D show electron beam diffraction images of the areas labeled as NBD1, NBD2, NBD3, and NBD4 in the TEM image of the cross section in FIG. 4.

Figure 5A:
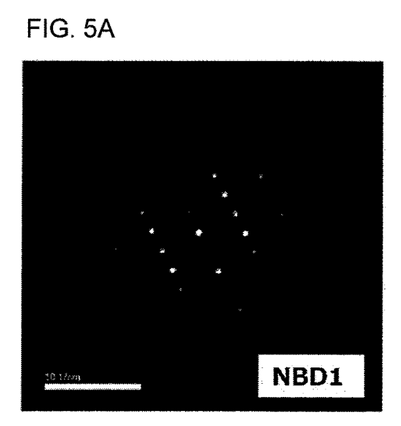
FIG. 5A is an electron beam diffraction image of the area labeled as NBD1 in the TEM image in FIG. 4.
Figure 5B:
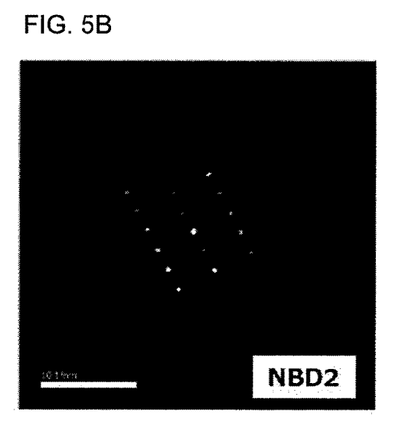
FIG. 5B is an electron beam diffraction image of the area labeled as NBD2 in the TEM image in FIG. 4.
Figure 5C:
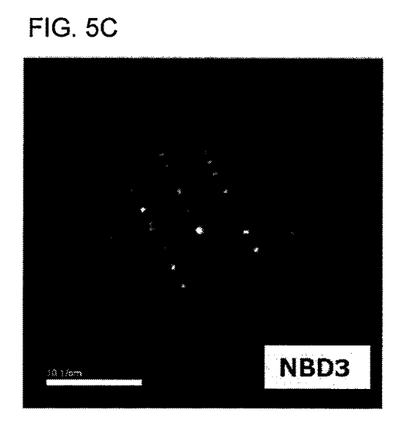
FIG. 5C is an electron beam diffraction image of the area labeled as NBD3 in the TEM image, in FIG. 4.
Figure 5D:
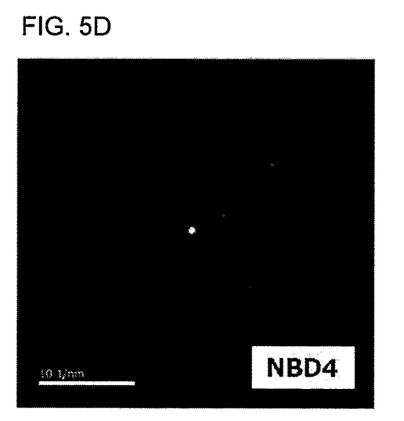
FIG. 5D is an electron beam diffraction image of the area labeled as NBD4 in the TEM image in FIG. 4.

FIG. 5A is an electron beam diffraction image of a portion of the single crystal sapphire labeled as NBD1, FIG. 5B is an electron beam diffraction image of a portion of the bonding portion of the sapphire labeled as NBD2, FIG. 5C is an electron beam diffraction image of a portion of the bonding portion of the YAG ceramic labeled as NBD3, and FIG. 5D is an electron beam diffraction image of a portion of the YAG ceramic labeled as NBD4. As shown in FIGS. 5A through 5D, diffraction spots were observed in all labeled areas, showing that the crystallinity is retained. Conceivable explanations for the diffraction image FIG. 5C being similar to those of FIGS. 5A and 5B include the possible presence of sapphire in the area NBD3, and the possible inclusion of the information captured from the sapphire portion because the electron beam size was larger than the area NBD3. In FIG. 4, the contrast differed between the portions up to a depth of about several nanometers from the bonding interface and the portions deeper than that, for both the sapphire and the YAG ceramic. This indicates that the portions up to about several nanometers from the bonding interface are the strained layers as described earlier. These strained layers were present along the bonding interface.

Figure 6A:
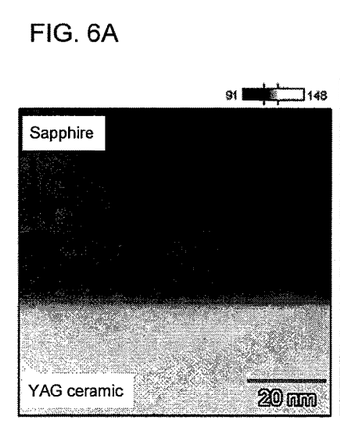
FIG. 6A is a high-angle annular dark-field scanning electron microscope image of the cross section of a portion that includes a portion of the sapphire substrate and a portion of the YAG ceramic in the example.
Figure 6B:
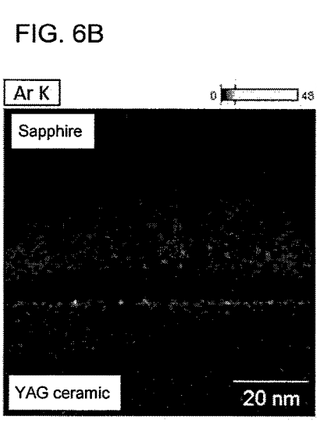
FIG. 6B shows EDX mapping of the Ar K line at the same portion as FIG. 6A.
Figure 6C:
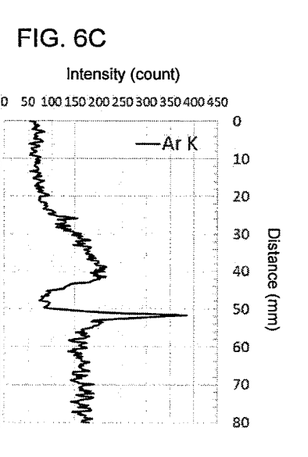
FIG. 6C is a line profile of the Ar K line at the cross section shown in FIG. 6B.

FIG. 6A is a cross section of the portion that includes the bonding portion and the portions of the sapphire substrate and the YAG ceramic intervened by the bonding portion, which has been observed by using a high-angle annular dark-field scanning electron microscope. The darker area on the upper side of FIG. 6A represents the sapphire, and the lighter area on the lower side represents the YAG ceramic. FIG. 6B is an EDX intensity map showing the Ar K line distribution in the same area in FIG. 6A. FIG. 6C is a line profile from the top to bottom of FIG. 6B where the vertical axis represents the distance from the upper edge of the image shown in FIG. 6B. That is, the origin shown is the position in the sapphire at the depth of about 50 nm from the emission surface (i.e., bonding surface). The location 50 nm distant from the origin is the emission surface, in other words, the bonding interface, the portion of up to about 50 nm from the origin represents the sapphire, and the portion further than about 50 nm represents the YAG ceramic.

It is considered that the intensity of the background is observed in the portion of up to 15 nm from the origin on the sapphire side where substantially no Ar is contained. In this example, the first bonding portion on the sapphire side that forms the bonding portion is the portion of up to 15 nm to 50 nm from the origin, in other words, the portion having a depth of about 35 nm from the bonding interface. The portion of up to about 45 nm to 50 nm from the origin, in other words, the portion to the depth of about 5 nm from the bonding interface toward the light emitting element, has substantially the same intensity (counts) as those in the portion of up to 15 nm from the origin. Thus the Ar content is considered substantially nonexistent or limited close to being nonexistent. As described above, the distribution of the Ar content in the first bonding portion on the sapphire side is relatively small at the bonding interface and the vicinity, and relatively large at a position more distant than that from the bonding interface.

In this example, the second bonding portion on the YAG ceramic side that forms the bonding portion is the portion of up to 50 nm to 60 nm from the origin, in other words, the portion having a depth of up to 10 nm from the bonding interface. The portion at 60 nm from the origin or further therefrom in the light transmissive member is the background portion containing substantially no Ar. The intensity (counts) in the background on the sapphire side differ from the intensity (counts) in the background on the YAG ceramic side because the materials from which they are composed are different.

As described above and shown in FIG. 6, the sapphire has the peak of Ar distribution positioned away from the bonding interface.

In the case in which the Ar ion beam perpendicularly enters the sapphire surface, based on the calculation assuming that the ion beam accelerating voltage is about 1 keV, the penetration depth of Ar ions into the sapphire is about 5 nm. In the case of diagonal incidence, the penetration depth should be smaller. However, despite the fact that Ar ions were diagonally incident upon sapphire, deeper injection of Ar was confirmed from FIG. 6C. This is believed to have been the result of the channeling phenomenon. That is, ions presumably passed through between sapphire crystal lattices, thereby reducing the number of ions that were scattered.

The peak of the Ar distribution in the YAG ceramic was at the portion estimated as being the bonding interface, in other words, the peak substantially coincided with the bonding interface.

What is claimed is:

1. A light emitting device comprising:
    a light emitting element; and
    a light transmissive member bonded to an emission surface of the light emitting element;
    wherein the light emitting element and the light transmissive member are bonded via a bonding portion that comprises a portion of the light emitting element and a portion of the light transmissive member;
    wherein the bonding portion contains at least one rare gas element selected from the group consisting of He, Ne, Ar, and Kr; and
    wherein a peak of a rare gas element distribution is positioned away from the emission surface in at least one of the light emitting element and the light transmissive member.

2. The light emitting device according to claim 1, wherein:
    each of the light emitting element and the light transmissive member comprises a strained layer at the bonding portion.

3. The light emitting device according to claim 2, wherein:
    the light emitting element comprises:
      a substrate, and
      a semiconductor stack formed on the substrate; and
    the bonding portion comprises a portion of the substrate.

4. The light emitting device according to claim 3, wherein:
the substrate is made of sapphire.

5. The light emitting device according to claim 4, wherein:
the substrate has a peak of Ar distribution positioned away from the emission surface.

6. The light emitting device according to claim 5, wherein:
the rare gas element is Ar.

7. The light emitting device according to claim 3, wherein:
the light transmissive member contains a phosphor.

8. The light emitting device according to claim 3, wherein:
the light transmissive member is a YAG ceramic.

9. The light emitting device according to claim 3, wherein:
the rare gas element is Ar.

10. The light emitting device according to claim 1, wherein:
the light emitting element comprises:
a substrate, and
a semiconductor stack formed on the substrate; and
the bonding portion comprises a portion of the substrate.

11. The light emitting device according to claim 10, wherein:
the substrate is made of sapphire.

12. The light emitting device according to claim 11, wherein:
the substrate has a peak of Ar distribution positioned away from the emission surface.

13. The light emitting device according to claim 12, wherein:
the rare gas element is Ar.

14. The light emitting device according to claim 10, wherein:
the substrate is made of GaN.

15. The light emitting device according to claim 10, wherein:
the substrate is a single-crystal substrate.

16. The light emitting device according to claim 1, wherein:
the light transmissive member contains a phosphor.

17. The light emitting device according to claim 1, wherein:
the light transmissive member is a YAG ceramic.

18. The light emitting device according to claim 1, wherein:
the rare gas element is Ar.

* * * * *